(12) United States Patent
Silva et al.

(10) Patent No.: US 10,049,710 B2
(45) Date of Patent: Aug. 14, 2018

(54) MAGNETIC ARTICLE AND ROTATION OF MAGNETIC SPINS VIA SPIN-ORBIT EFFECT IN SAME

(71) Applicant: The United States of America, as Represented by the Secretary of Commerce, Washington, DC (US)

(72) Inventors: Thomas Silva, Boulder, CO (US); Justin Shaw, Boulder, CO (US); Eric Edwards, Boulder, CO (US); Xin Fan, Highlands Ranch, CO (US); Hans Nembach, Boulder, CO (US)

(73) Assignees: THE UNITED STATES OF AMERICA, AS REPRESENTED BY THE SECRETARY OF COMMERCE, Washington, DC (US); UNIVERSITY OF DENVER, Denver, CO (US)

( * ) Notice: Subject to any disclaimer, the term of this patent is extended or adjusted under 35 U.S.C. 154(b) by 0 days.

(21) Appl. No.: 15/695,173

(22) Filed: Sep. 5, 2017

(65) Prior Publication Data
US 2018/0090194 A1   Mar. 29, 2018

Related U.S. Application Data

(60) Provisional application No. 62/401,361, filed on Sep. 29, 2016.

(51) Int. Cl.
| | |
|---|---|
| *G11C 11/00* | (2006.01) |
| *G11C 11/16* | (2006.01) |
| *H01L 43/02* | (2006.01) |
| *H01L 27/22* | (2006.01) |

(Continued)

(52) U.S. Cl.
CPC ........ *G11C 11/161* (2013.01); *G11C 11/1673* (2013.01); *G11C 11/1675* (2013.01); *G11C 11/1697* (2013.01); *H01L 27/222* (2013.01); *H01L 43/02* (2013.01); *H01L 43/08* (2013.01); *H01L 43/10* (2013.01)

(58) Field of Classification Search
CPC .............. G11C 11/161; G11C 11/1673; G11C 11/1675; G11C 11/1697; H01L 27/222; H01L 43/02; H01L 43/08; H01L 43/10
See application file for complete search history.

(56) References Cited

U.S. PATENT DOCUMENTS

| | | | |
|---|---|---|---|
| 9,230,626 B2 | 1/2016 | Buhrman et al. | |
| 9,502,087 B2 | 11/2016 | Buhrman et al. | |
| 9,576,636 B1 * | 2/2017 | Slaughter | ............ G11C 11/1675 |

(Continued)

OTHER PUBLICATIONS

Kent, A.D., et al., "A new spin on magnetic memories", Nature Nanotechnology, 2015, 187-191, 10.

(Continued)

*Primary Examiner* — Toan Le
(74) *Attorney, Agent, or Firm* — Office of Chief Counsel for National Institute of Standards and Technology

(57) ABSTRACT

A nonvolatile memory cell includes: a first fixed magnetic layer; a first nonmagnetic electrode disposed on the first magnetic layer; a memory storage layer disposed on the first nonmagnetic electrode; a tunnel barrier layer disposed on the memory storage layer; a second fixed magnetic layer disposed on the tunnel barrier layer; and a second nonmagnetic electrode disposed on the second fixed magnetic layer.

10 Claims, 12 Drawing Sheets

(51) Int. Cl.
 H01L 43/08 (2006.01)
 H01L 43/10 (2006.01)

(56) References Cited

U.S. PATENT DOCUMENTS

| | | | |
|---|---|---|---|
| 9,691,458 B2 | 6/2017 | Ralph et al. | |
| 2008/0144232 A1* | 6/2008 | Kaka | G11B 5/3903 360/324.1 |
| 2013/0015542 A1* | 1/2013 | Wang | H01L 43/08 257/421 |
| 2014/0363701 A1* | 12/2014 | Hu | G11B 5/62 428/832 |
| 2016/0049185 A1* | 2/2016 | Lu | G11C 11/1659 365/158 |
| 2016/0336508 A1* | 11/2016 | Guo | H01L 43/12 |
| 2017/0098761 A1* | 4/2017 | Worledge | H01L 43/10 |
| 2017/0170388 A1* | 6/2017 | Whig | H01L 43/02 |

OTHER PUBLICATIONS

Humphries, A.M., et al., "Observation of spin-orbit effects with spin rotation symmetry", Nature Communications, 2017.

\* cited by examiner

MAGNETIC ARTICLE AND ROTATION OF MAGNETIC SPINS VIA SPIN-ORBIT EFFECT IN SAME

CROSS REFERENCE TO RELATED APPLICATIONS

This application claims the benefit of U.S. Provisional Patent Application Ser. No. 62/401,361, filed Sep. 29, 2016, the disclosure of which is incorporated herein by reference in its entirety.

This patent application is under obligation of assignment to the United States of America, as represented by the Secretary of Commerce. NIST has a proprietary interest in the application under 35 U.S.C. § 207.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov.

BRIEF DESCRIPTION

Disclosed is a nonvolatile memory cell to store a memory bit, the nonvolatile memory cell comprising: a first fixed magnetic layer comprising a first fixed magnetic state and that conducts electrical current; a first nonmagnetic electrode disposed on the first magnetic layer and that conducts electrical current; a memory storage layer disposed on the first nonmagnetic electrode and comprising the memory bit, the memory bit being in a first magnetic state or a second magnetic state, the memory storage layer being switchable between the first magnetic state and the second magnetic state in response to a direction of electrical current present in the first nonmagnetic electrode, the memory bit being stored in the memory storage layer as the first magnetic state or the second magnetic state, the first nonmagnetic electrode being interposed between the first fixed magnetic layer and the memory storage layer, and the first fixed magnetic state being oriented orthogonal to the first magnetic state and the second magnetic state; a tunnel barrier layer disposed on the memory storage layer such that the memory storage layer is interposed between the tunnel barrier layer and the first nonmagnetic electrode; a second fixed magnetic layer comprising a second fixed magnetic state and that conducts electrical current, the tunnel barrier layer interposed between the memory storage layer and the second fixed magnetic layer, and the second fixed magnetic state being aligned with the memory bit in the memory storage layer; and a second nonmagnetic electrode disposed on the second fixed magnetic layer and that conducts electrical current, the second fixed magnetic layer being interposed between the tunnel barrier layer and the second nonmagnetic electrode.

Also disclosed is, in a memory system comprising a nonvolatile memory cell, a process for writing or reading the memory bit, the process comprising: subjecting the first nonmagnetic electrode to an electrical current flowing in a first direction through the first nonmagnetic electrode; and storing the memory bit as the first magnetic state in the memory storage layer, in response to the electrical current flowing in the first direction through the first nonmagnetic electrode, to write the memory bit in the nonvolatile memory cell.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

Advantageously and unexpectedly, it has been discovered that a nonvolatile memory cell herein provides low power consumption, high speed, and extremely dense scalability. Moreover, electrical current flowing in a fixed magnetic layer switches magnetization in an adjacent memory storage layer that includes magnetic material. Here, magnetic spin rotation in combination with a magnetic spin Hall effect provide memory bit storage and retrieval in a ferromagnetic metal of the memory storage layer. The nonvolatile memory cell provides high endurance and high density in memory storage.

Figure 1:
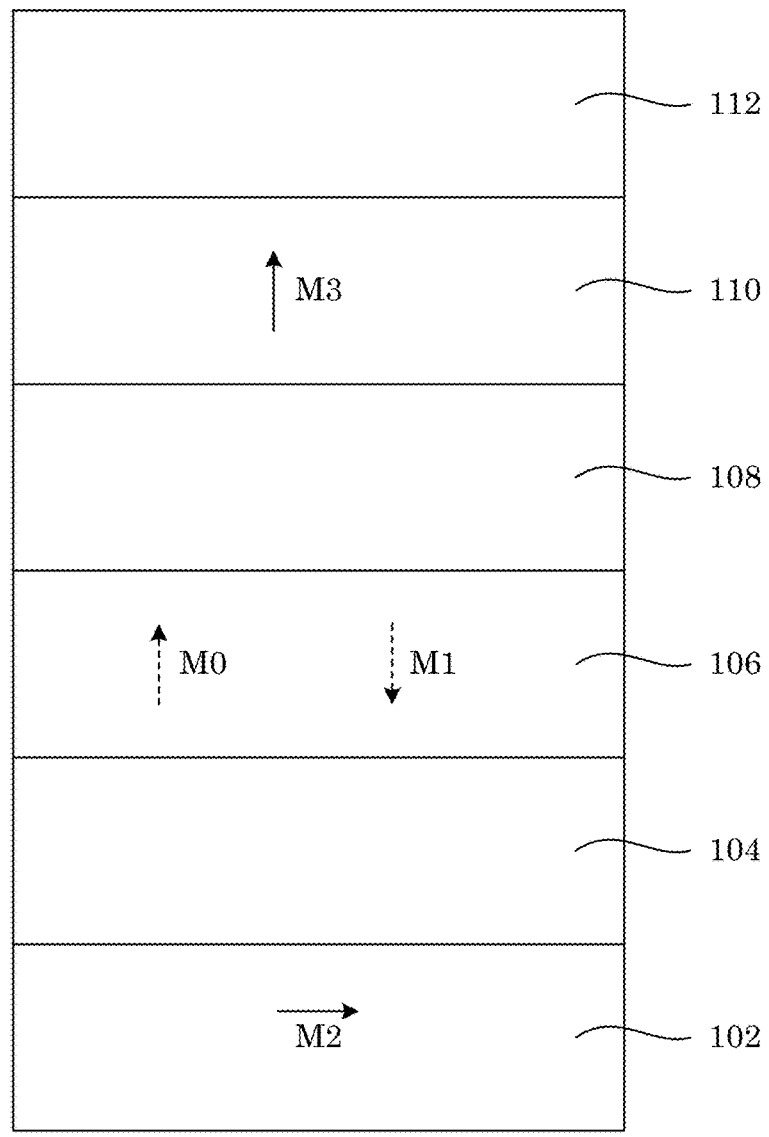
FIG. 1 shows a nonvolatile memory cell.

In an embodiment, with reference to FIG. 1, nonvolatile memory cell 100 includes first fixed magnetic layer 102; first nonmagnetic electrode 104 disposed on first magnetic layer 102; memory storage layer 106 disposed on first nonmagnetic electrode 104; tunnel barrier layer 108 disposed on memory storage layer 106; second fixed magnetic layer 110 disposed on tunnel barrier layer 108; and second nonmagnetic electrode 112 disposed on second fixed magnetic layer 110. Here, first fixed magnetic layer 102 includes first fixed magnetic state FM1 and conducts electrical current. Also, first nonmagnetic electrode 104 conducts electrical current. Memory storage layer 106 includes the memory bit, and the memory bit is in first magnetic state M1 or second magnetic state M2, wherein memory storage layer 106 is switchable between first magnetic state M1 and second magnetic state M2 in response to a direction of electrical current present in first nonmagnetic electrode 104 and first fixed magnetic layer 102 such that the memory bit is stored or written in memory storage layer 106 as first magnetic state M1 or second magnetic state M2. First nonmagnetic electrode 104 is interposed between first fixed magnetic layer 102 and memory storage layer 106, and first fixed magnetic state FM1 is oriented orthogonal to first magnetic state M0 and second magnetic state M1. Tunnel barrier layer 108 is disposed on memory storage layer 106 such that memory storage layer 106 is interposed between tunnel barrier layer 108 and first nonmagnetic electrode 104. Further, second fixed magnetic layer 110 includes second fixed magnetic state FM2 and conducts electrical current such that tunnel barrier layer 108 is interposed between memory storage layer 106 and second fixed magnetic layer 110. Second fixed magnetic state FM2 is aligned with the memory bit in memory storage layer 106. Additionally, second nonmagnetic electrode 112 is disposed on second fixed magnetic layer 110 such that second fixed magnetic layer 110 is interposed between tunnel barrier layer 108 and second nonmagnetic electrode 112.

Figure 2:
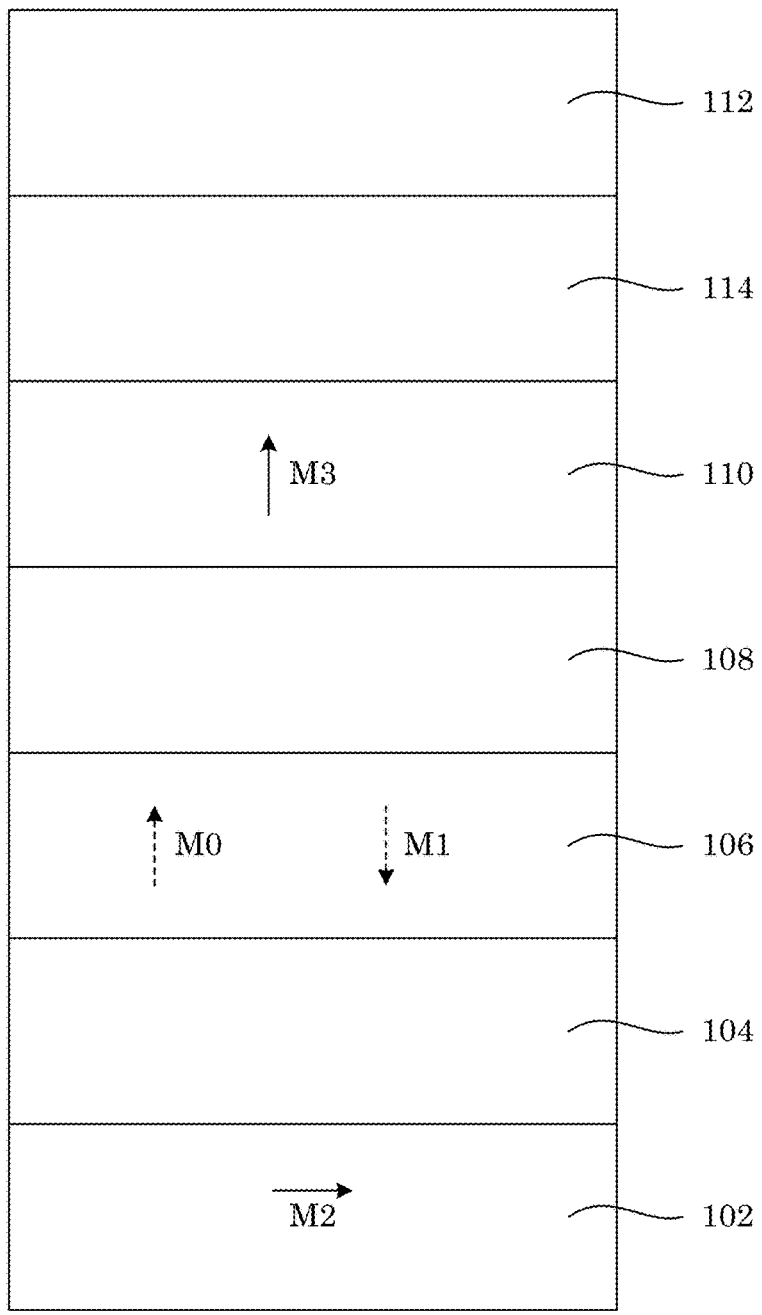
FIG. 2 shows a nonvolatile memory cell.

In an embodiment, with reference to FIG. 2, nonvolatile memory cell 100 includes intermediate layer 114 interposed between second fixed magnetic layer 110 and second nonmagnetic electrode 112.

Figure 3:
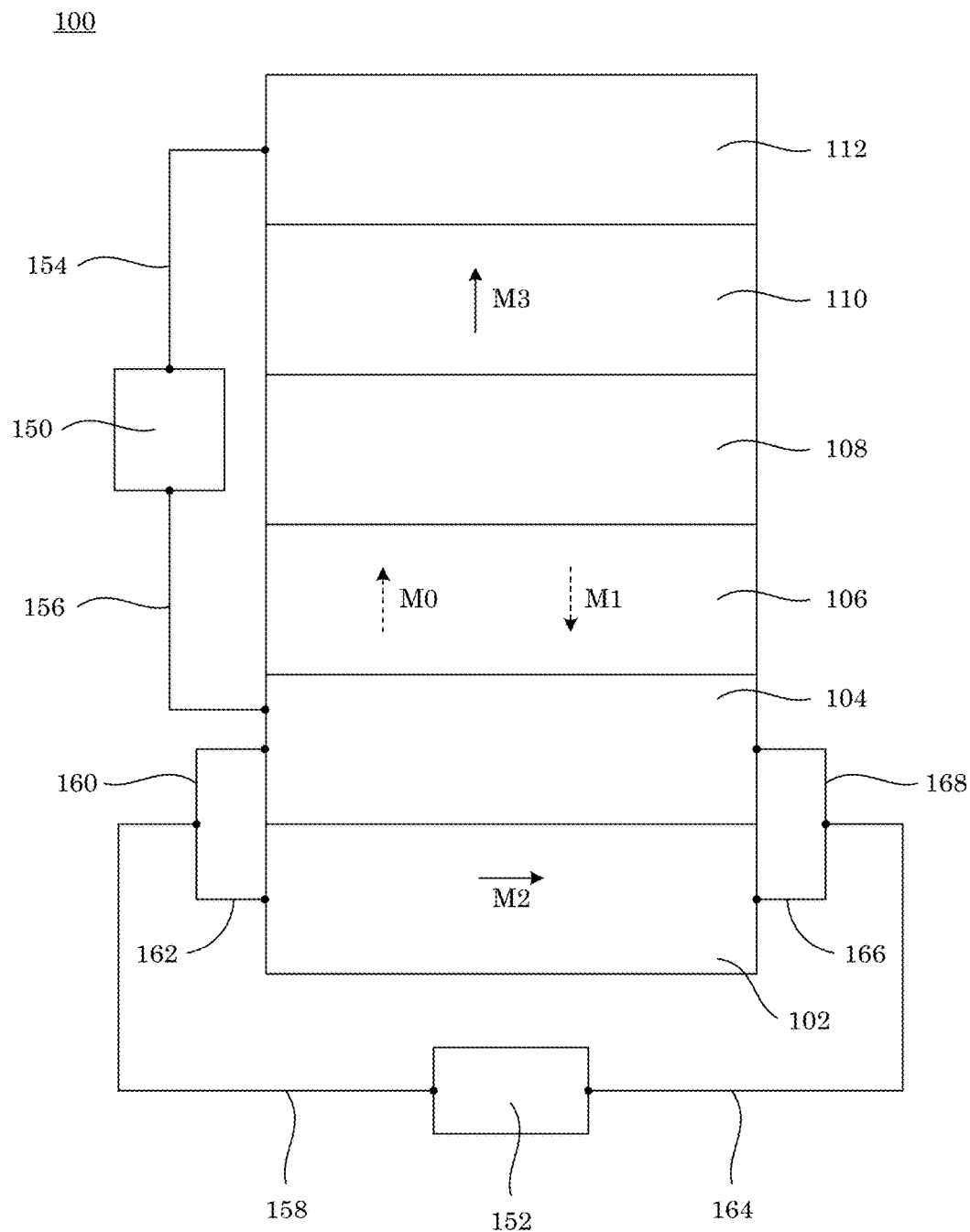
FIG. 3 shows a nonvolatile memory cell.

In an embodiment, with reference to FIG. 3, nonvolatile memory cell 100 includes power source 152 in electrical communication with first fixed magnetic layer 102 and first nonmagnetic electrode 104 via electrical wires (158, 160, 162, 164, 166, 168). Power source 152 provides electrical current that flows through first fixed magnetic layer 102 and first nonmagnetic electrode 104. When the electrical current flows in first direction I1 in first nonmagnetic electrode 104, the memory bit is in first memory state M0 in memory storage layer 106. When the electrical current flows in second direction I2 in first nonmagnetic electrode 104, the memory bit is in second memory state M1 in memory storage layer 106.

Figure 10:
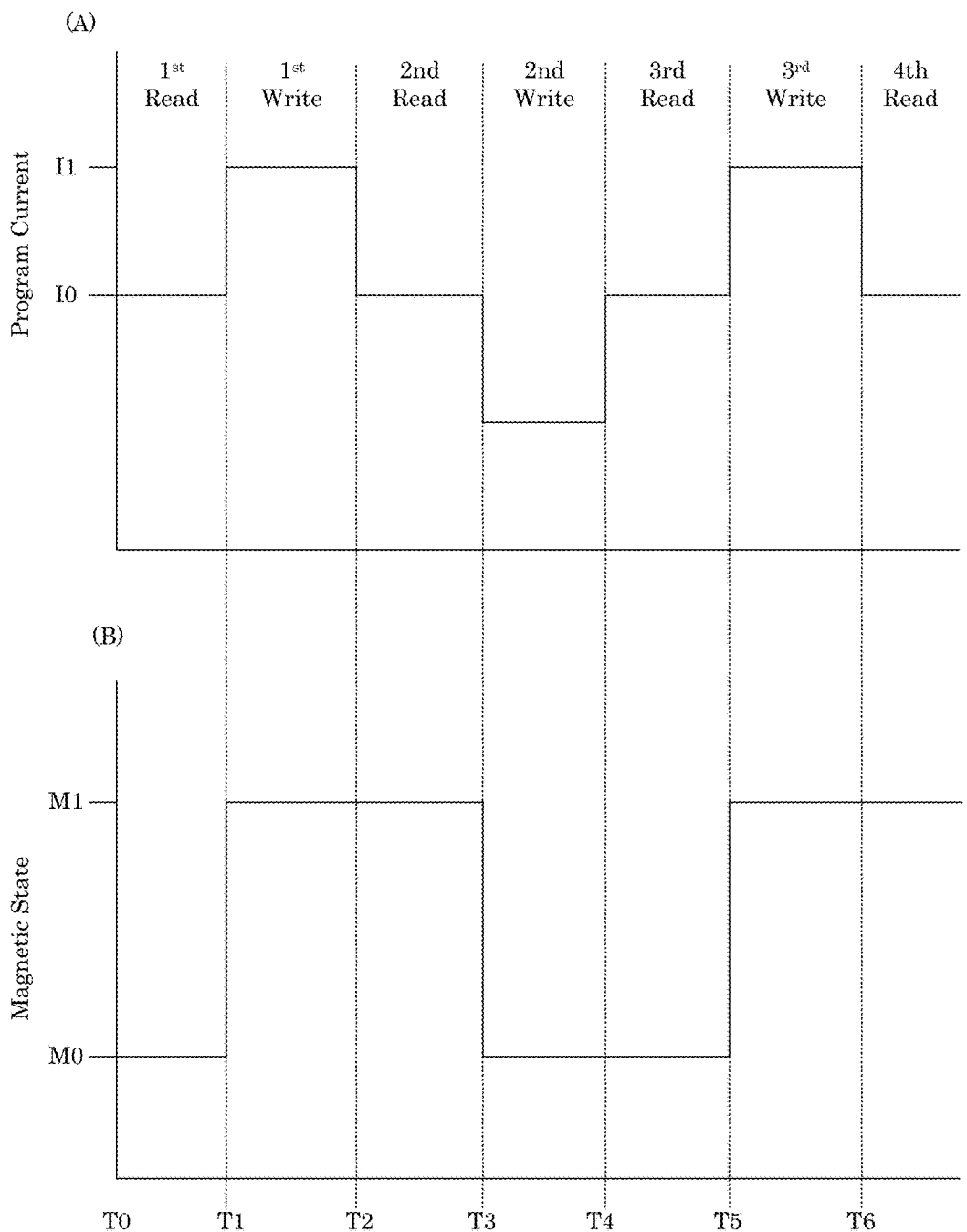
FIG. 10 shows graphs of program current and magnetic state versus time.

Nonvolatile memory cell 100 also can include resistance meter 150 in electrical communication with first nonmagnetic electrode 104 and second nonmagnetic electrode 112 nanowires 156 and 154. Resistance meter 150 measures an electrical resistance across memory storage layer 106. The electrical resistance across memory storage layer 106 can be relative to the little resistance of second fixed magnetic layer 110. Here, memory storage layer 106 has first electrical resistance R0 in first magnetic state M0, and memory storage layer 106 has second electrical resistance R1 in second magnetic state M1 as shown in FIG. 10.

Figure 4:
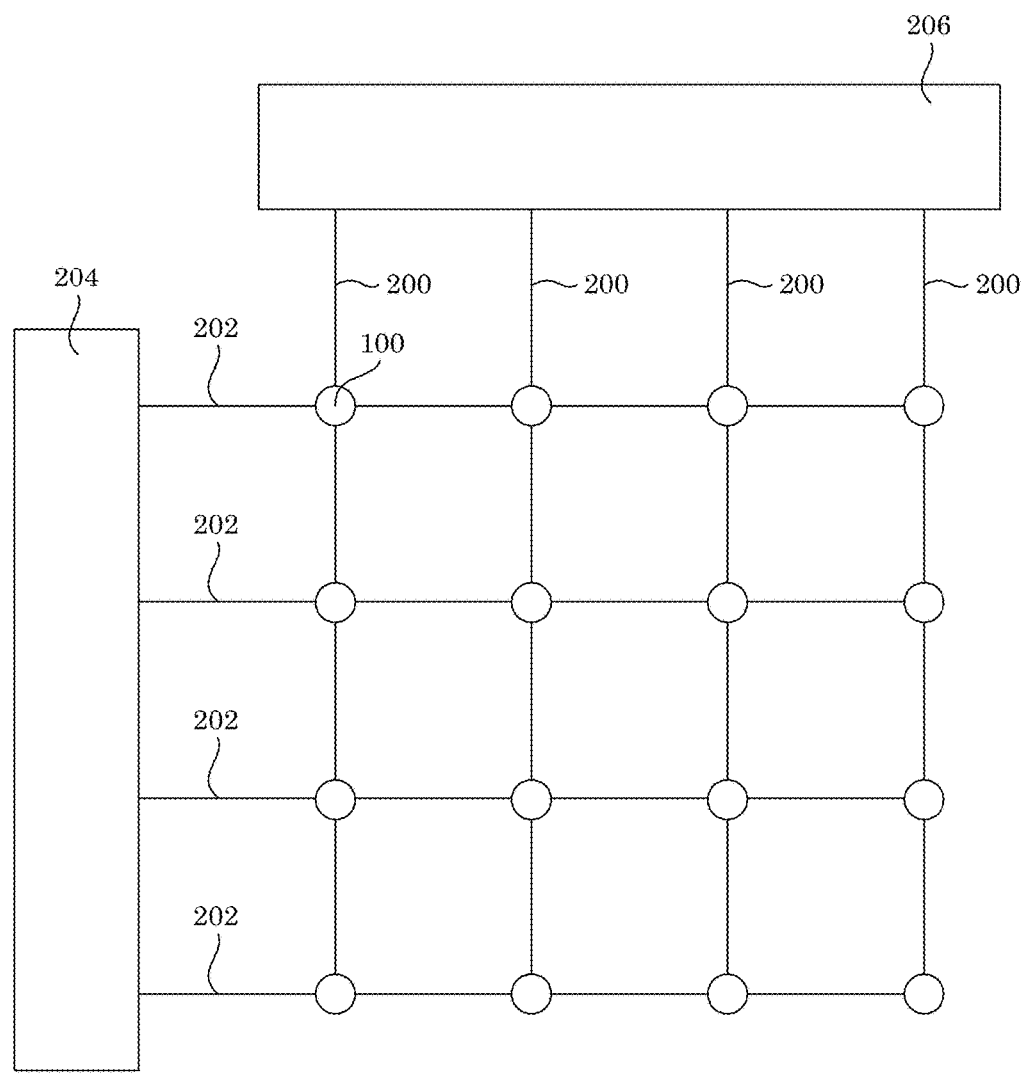
FIG. 4 shows a plurality of a nonvolatile memory cells in an array format for high density memory storage.
Figure 5:
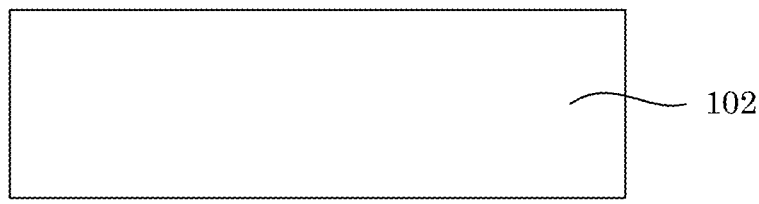
FIG. 5 shows a step in making a nonvolatile memory cell.
Figure 6:
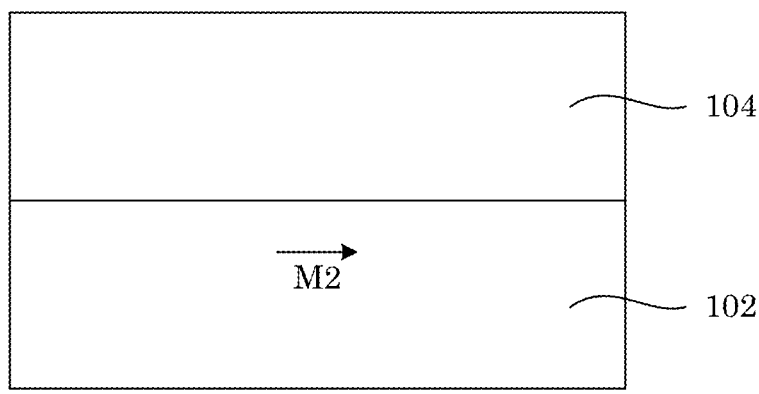
FIG. 6 shows a step in making a nonvolatile memory cell.
Figure 7:
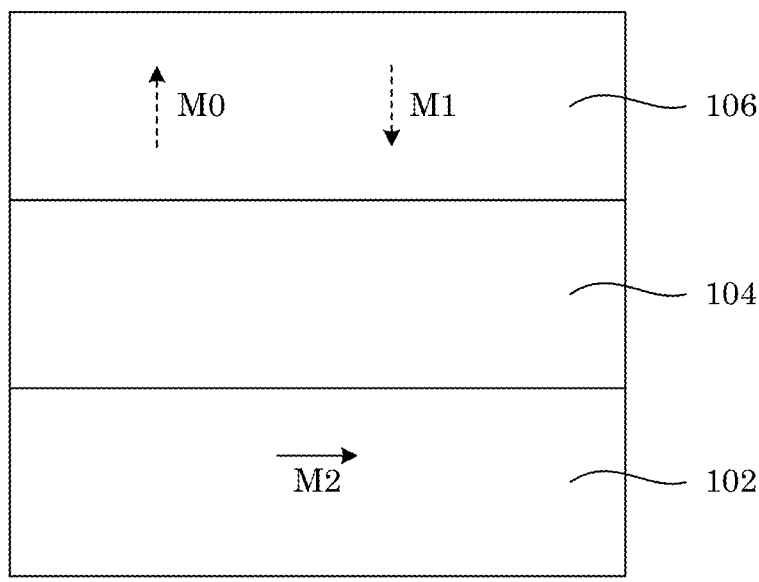
FIG. 7 shows a step in making a nonvolatile memory cell.
Figure 8:
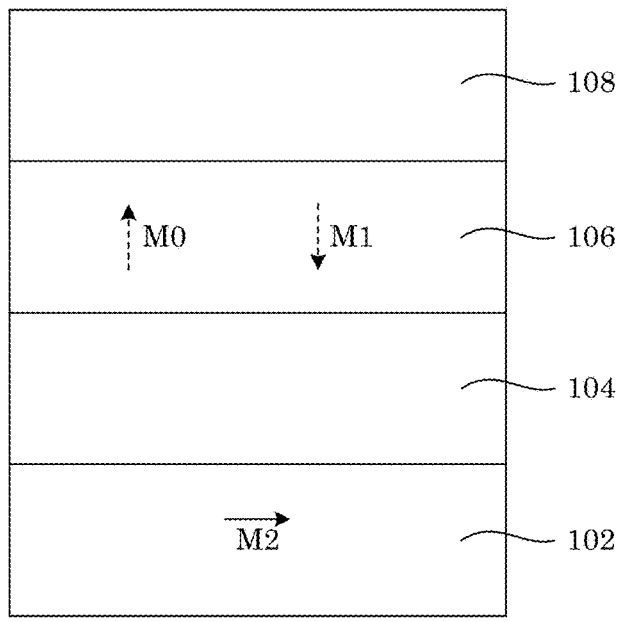
FIG. 8 shows a step in making a nonvolatile memory cell.
Figure 9:
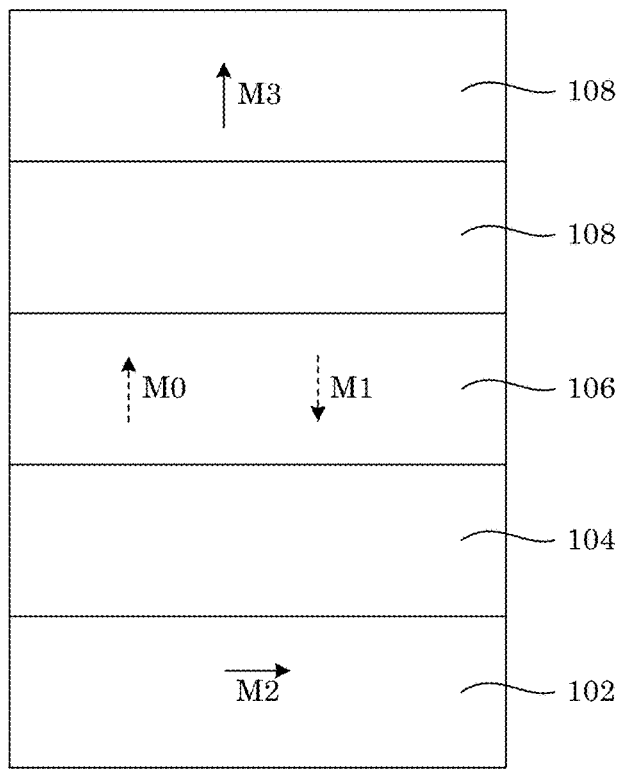
FIG. 9 shows a step in making a nonvolatile memory cell.

In an embodiment, with reference to FIG. 4, computing system 200 includes storage drive 180, first controller 204, and second controller 206. Storage drive 180 includes plurality of nonvolatile memory cells 100 arranged in an array and connected to first controller 204 via wires 202 and second controller 206 wires 200. In this manner, electrical power can be supplied individual nonvolatile memory cells 100 and individual memory bets can be written to or read from individual nonvolatile memory cells 100, wherein controllers (204, 206) in combination address individual nonvolatile memory cells 100. A number of nonvolatile memory cells 100 in storage drive 180 is not limited and can be any number selected to read and write memory bits. A size of storage drive 180 can be selected to be application of computing system 200.

Nonvolatile memory cell 100 can have a size selected for a give application for storage of a memory bit. A volume of nonvolatile memory cell can be, e.g., from 2e1 $nm^3$ to 5e7 $nm^3$, specifically from 2e1 $nm^3$ to 1e6 $nm^3$, and more specifically from 2e1 $nm^3$ to 1e4 $nm^3$. An amount of electrical current to store the memory bit in memory storage layer 106 and that flows through first nonmagnetic lecture 104 and first fixed magnetic layer 102 is an amount effective to change between first magnetic state M0 and second magnetic state M1. It is contemplated that the amount of electrical current can be, e.g., from 1 µA to 1 mA, specifically from 10 µA to 100 µA, and more specifically from 10 µA to 50 µA. Further, an electrical resistance difference of memory storage layer 106 in first magnetic state M0 and second magnetic state M1 can be, e.g., from 10Ω to 1e4Ω, specifically from 50Ω to 1e3Ω, and more specifically from 50Ω to 200Ω.

First fixed magnetic layer 102 of nonvolatile memory cell 100 provides first fixed magnetic state FM1. A thickness of first fixed magnetic layer 102 can be can be from 0.5 nm to 100 nm, specifically from 1 nm to 20 nm, and more specifically from 1 nm to 5 nm. Exemplary materials for first fixed magnetic layer 102 include iron, nickel, cobalt, or a combination thereof.

First nonmagnetic electrode 104 provides an electrically conductive path of the electrical current and through spin-orbit coupling of electrons therein switches the memory bit in memory storage layer 106 between first magnetic state M0 and second magnetic state M1. A thickness of first nonmagnetic electrode 104 can be can be from 0.5 nm to 100 nm, specifically from 1 nm to 20 nm, and more specifically from 1 nm to 5 nm. Exemplary materials for first nonmagnetic electrode 104 include nonmagnetic material such as Cu, Au, Ag, or a combination thereof.

Memory storage layer 106 provides storage of the memory bit in first magnetic state M0 or second magnetic state M1. A thickness of memory storage layer 106 can be can be from 0.5 nm to 10 nm, specifically from 1 nm to 4 nm, and more specifically from 1 nm to 2 nm. Exemplary materials for memory storage layer 106 include cobalt, iron, nickel, or a combination thereof.

Tunnel barrier layer 108 provides magnetic contrast in the form of a magnetization dependent resistance for current flowing through the storage layer stack consisting of layers 104 through 112. A thickness of tunnel barrier layer 108 can be can be from 0.3 nm to 3 nm, specifically from 0.5 nm to 2 nm, and more specifically from 0.5 to 1 nm. Exemplary materials for tunnel barrier layer 108 include magnesium oxide (MgO), aluminum oxide ($Al_2O_3$), carbon (C), or a combination thereof.

Second fixed magnetic layer 110 of nonvolatile memory cell 100 provides second fixed magnetic state FM2. A thickness of second fixed magnetic layer 110 can be can be from 100 nm to 1 nm, specifically from 20 nm to 2 nm, and more specifically from 10 nm to 5 nm. Exemplary materials for second fixed magnetic layer 110 include cobalt, iron, nickel, or a combination thereof.

Intermediate layer 114 provides exchange bias in order to stabilize and fix the magnetization of second fixed magnetic layer 110. A thickness of intermediate layer 114 can be can be from 100 nm to 1 nm, specifically from 50 nm to 2 nm, and more specifically from 10 nm to 5 nm. Exemplary materials for intermediate layer 114 include nickel oxide (NiO), ruthenium (Ru), iridium manganese (IrMn), or a combination thereof.

Second magnetic electrode 112 provides additional stabilization and control of the free magnetic layer 106 via cancellation of any stray magnetic field from the fixed magnetic layer 110. A thickness of second nonmagnetic electrode 112 can be can be from 0.5 nm to 100 nm, specifically from 1 nm to 20 nm, and more specifically from 1 nm to 5 nm. Exemplary materials for second nonmagnetic electrode 112 include magnetic material such as cobalt, iron, nickel, or a combination thereof.

Power source 152 provides voltage and current to drive the switching of magnetic layer 106. Moreover, power source 152 can be controlled in terms of timing, duration, and current amplitude during the switching process.

Resistance meter 150 provides the ability to determine the magnetic-dependent tunnel magnetoresistance that impedes current flow through the storage stack. Moreover, resistance meter 150 provides a bias voltage for the measurement of the tunnel magnetoresistance.

Controllers (204, 206) provides timing and power control for both the writing and reading process. Moreover, controllers (204, 206) allow for selection of the particular bit in the array that should be written to or read from.

In an embodiment, with reference to FIG. 5, FIG. 6, FIG. 7, FIG. 8, and FIG. 9, a process for making nonvolatile memory cell includes deposition of all layers via sputtering, evaporation, or any other thin film deposition method.

In an embodiment, a process for making system 200 includes deposition of all materials via processing methods such as electrochemical platting, evaporation, sputter deposition, or molecular beam epitaxy, and subsequent patterning of the materials into devices via lithographic processing methods.

Figure 11:
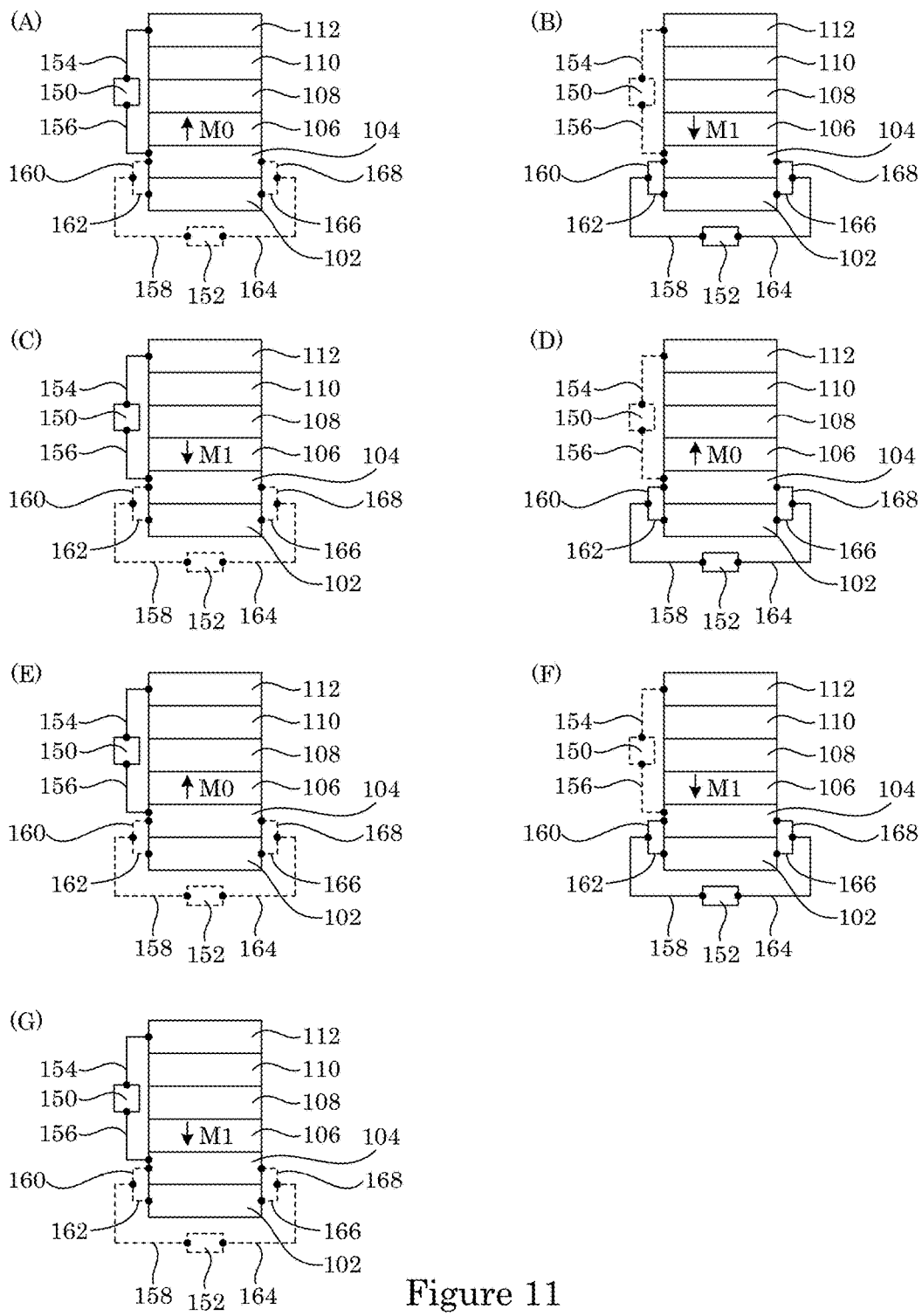
FIG. 11 shows magnetic states for a memory bit in a nonvolatile memory cell corresponding to the read and write periods shown in FIG. 10.

According to an embodiment, with reference to FIG. 10 and FIG. 11, in a memory system including nonvolatile memory cell 100, a process for writing or reading the memory bit includes: subjecting first nonmagnetic electrode 104 to an electrical current flowing in first direction I1 through first nonmagnetic electrode 104; and storing the memory bit as first magnetic state M0 in memory storage layer 106, in response to the electrical current flowing in first direction I1 through first nonmagnetic electrode 104, to write the memory bit in nonvolatile memory cell 100. The process further can include measuring an electrical resistance of memory storage layer 106 relative to second fixed magnetic layer 110 to read the memory bit stored in memory storage layer 106 of nonvolatile memory cell 100. The process also can include: subjecting first nonmagnetic electrode 104 to an electrical current flowing in second direction I2 through first nonmagnetic electrode 104; and storing the memory bit as second magnetic state M1 in memory storage layer 106, in response to the electrical current flowing in second direction I2 through first nonmagnetic electrode 104, to write the memory bit in nonvolatile memory cell 100. The process further can include measuring an electrical resistance of memory storage layer 106 relative to second fixed magnetic layer 110 to read the memory bit stored in memory storage layer 106 of nonvolatile memory cell 100.

It is contemplated that in the process, subjecting first nonmagnetic electrode 104 to the electrical current flowing in first direction I1 includes use of a power supply to provide said current, and control electronics to determine both the timing, duration, and magnitude of said current.

Storing the memory bit as first magnetic state M0 in memory storage layer 106 includes application of sufficient current of a selected strength and duration to allow for complete, deterministic switching of the magnetization in storage layer 106.

Measuring the electrical resistance of memory storage layer 106 relative to second fixed magnetic layer 110 to read the memory bit stored as first magnetic state M0 includes application of a bias voltage across the tunnel junction layer 108 of sufficient amplitude and duration to permit unambiguous determination of the magnetization state in layer 106, e.g. by measurement of the tunnel barrier resistance.

Subjecting first nonmagnetic electrode 104 to the electrical current flowing in second direction I2 includes use of a power supply to provide said current, and control electronics to determine both the timing, duration, and magnitude of said current.

Storing the memory bit as second magnetic state M1 includes application of sufficient current of a selected strength and duration to allow for complete, deterministic switching of the magnetization in storage layer 106.

Measuring an electrical resistance of memory storage layer 106 relative to second fixed magnetic layer 110 to read the memory bit stored as second magnetic state M1 includes application of a bias voltage across the tunnel junction layer 108 of sufficient amplitude and duration to permit unambiguous determination of the magnetization state in layer 106, e.g. by measurement of the tunnel barrier resistance.

An exemplary process for writing the memory bit to memory storage layer 106 and reading the memory bit stored in memory storage layer 106 is shown in panel A of FIG. 10, and panel B shows a graph of magnetic state versus time that corresponds to the read and write periods shown in panel A, wherein the solid curve corresponds the magnetic state, and the dashed curve corresponds to the electrical resistance of memory storage layer 106 relative to second fixed magnetic layer 110. Here, during first read period between time T0 and time T1, no current flows through first nonmagnetic electrode 104, and memory storage layer 106 is in first magnetic state M0 with first resistance R0. Panel A of FIG. 11 shows operation of nonvolatile memory cell 100 during the first read period. During first write period between time T1 and time T2, current flows in first direction I1 through first nonmagnetic electrode 104, and memory storage layer 106 switches from first magnetic state M0 with first resistance R0 to second magnetic state M1 with second electrical resistance R1. Panel B of FIG. 11 shows operation of nonvolatile memory cell 100 during the first write period. During second read period between time T2 and time T3, current is at I0, and memory storage layer 106 maintains second magnetic state M1 with second electrical resistance R1. Panel C of FIG. 11 shows operation of nonvolatile memory cell 100 during the second read period. During second write period between time T3 and time T4, current flows in second direction I2 through first nonmagnetic electrode 104, and memory storage layer 106 switches from second magnetic state M1 with second resistance R1 to first magnetic state M0 with first electrical resistance R0. Panel D of FIG. 11 shows operation of nonvolatile memory cell 100 during the second write period. During third read period between time T4 and time T5, current is at I0, and memory storage layer 106 maintains first magnetic state M0 with first electrical resistance R0. Panel E of FIG. 11 shows operation of nonvolatile memory cell 100 during the third read period. During third write period between time T5 and time T6, current flows in first direction I1 through first nonmagnetic electrode 104, and memory storage layer 106 switches from first magnetic state M0 with first resistance R0 to second magnetic state M1 with second electrical resistance R1. Panel F of FIG. 11 shows operation of nonvolatile memory cell 100 during the third write period. During fourth read period between time T6 and time T7 (not shown), current is at I0, and memory storage layer 106 maintains second magnetic state M1 with second electrical resistance R1. Panel F of FIG. 11 shows operation of nonvolatile memory cell 100 during the fourth read period.

Nonvolatile memory cell 100, system 200, and processes herein have numerous advantageous and beneficial properties. Advantageously, nonvolatile memory cell 100 provides the coincident use of a perpendicular magnetized magnetic storage layer 106 with an in-plane write current that flows in proximity to, but not through, the magnetic storage and readout stack, consisting of layers 106 through 112. By use of a proximate write current, one avoids passage of a large write current through the storage and readout stack that could otherwise cause catastrophic or subtle damage to the stack, e.g. via heating or electro migration effects. By use of a perpendicular magnetized storage layer 106, device stability with respect to thermal fluctuations is maximized. Finally, the combination of a proximate write current and a perpendicular magnetized storage layer is accomplished with a minimal increase in device complexity.

The articles and processes herein are illustrated further by the following Example, which is non-limiting.

Example

Large rotation of spin-orbit torques in metallic layers with orthogonally magnetized ferromagnets.

The spin-orbit interaction occurs in nonmagnetic/magnetic multilayers and provides conversion between a spin current and a charge current. In the spin-orbit torque (SOT) and inverse spin Hall/Rashba-Edelstein effects (ISHE/IREE), the charge current, spin current and spin directions are orthogonal to each other in the nonmagnetic material. This Example provides generation of SOT and ISHE/IREE voltage in unconventional directions in a magnetic metal. In a spin valve-like multilayer with orthogonal magnetization configurations, we observe SOTs on the in-plane magnetized layer in the direction that is rotated 90° from the conventional SOTs around the out-of-plane magnetization of the other magnetic layer. We measure the ISHE/IREE generated by an out-of-plane temperature gradient in the same sample and observe the ISHE/IREE voltage with a similar rotated symmetry. Spin-orbit effects in magnetic multilayers can be used magnetic random access memories.

Spin-orbit interaction in nonmagnetic materials leads to interconversion between charge current and spin current. Related phenomena that have been studied are the spin Hall effect (SHE), the Rashba-Edelstein effect (REE) and their inverse effects, ISHE/IREE. The SHE/REE enables efficient control of magnetization by a charge current, which leads to potential applications in magnetic random access memories and racetrack memories. These effects can usually be described by the same symmetry in polycrystalline or amorphous samples. For example, in a ferromagnetic/nonmagnetic bilayer film, an in-plane electric current generates a damping-like SOT $\tau_{DL}$ and a field-like SOT $\tau_{FL}$ on the magnetization, $$\tau_{DL} \propto \hat{m} \times (\hat{m} \times (\hat{I} \times \hat{z}))$$

$$\tau_{FL} \propto (\hat{m} \times (\hat{I} \times \hat{z})) \quad (1)$$

where $\hat{m}$ is the unit magnetization direction of the ferromagnet, $\hat{I}$ is a unit vector along the electric current direction, and $\hat{z}$ is a unit vector perpendicular to the film.

Similarly, if a perpendicular temperature gradient is applied, an electric field is generated due to the ISHE/IREE, whose geometry can be described as $$\vec{E} \propto \hat{m} \times \nabla \vec{T} \quad (2)$$

where $\nabla T$ is the temperature gradient.

This Example shows that in magnetic multilayers with orthogonal magnetizations, there are spin-orbit effects that cannot be described by Eqs. (1) and (2). Instead, they exhibit a rotated geometry as if the spins have precessed around the magnetizations.

Figure 12:
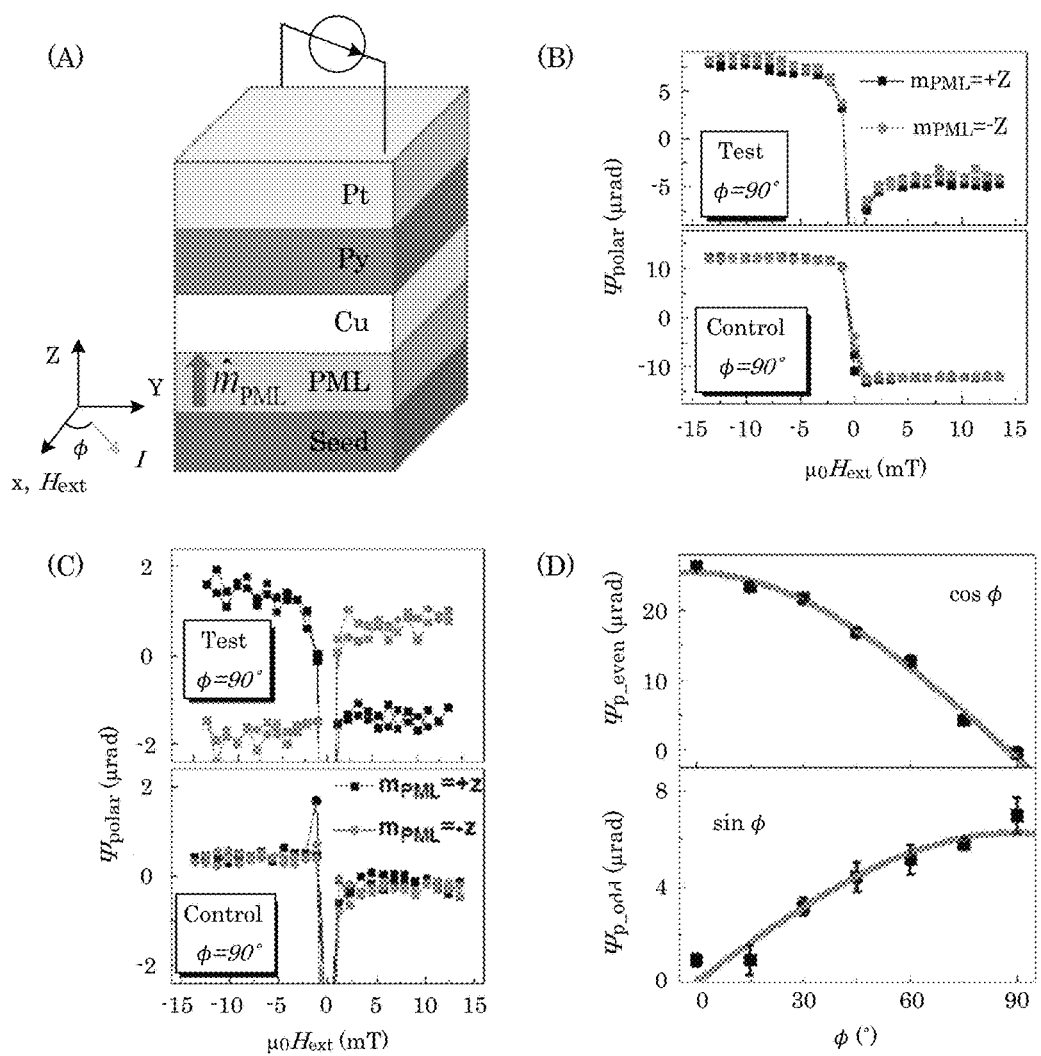
FIG. 12 shows, in panel A, experimental configurations for spin-orbit torque (SOT) measured by magneto-optic-Kerr-effect (MOKE), wherein an external field is swept along the x-direction, and the sample together with the applied current can be rotated in the film plane; out-of-plane magnetization tilting in permalloy (Py) due to damping-like fields is measured by polar MOKE in which the light is incident normally with linear polarization 45° from the x-direction. Panel (b) shows polar MOKE response measured in the test (top) and control samples (bottom) when current is applied parallelly with Hext in which no dependence on the initial magnetization of PML is observed; panel C includes polar MOKE response measured in the test (top) and control samples (bottom) when current is applied perpendicularly to Hext. In the test sample, the polar MOKE response is reversed when the initial magnetization of PML is reversed, and polar MOKE response in the control sample has little dependence on the initial magnetization of PML. Panel (d) shows angle dependence of $\Psi P\_even$ and $\Psi P\_odd$ of the test sample, wherein red lines are fittings using $\cos\phi$ and $\sin\phi$ functions.

First, we demonstrate the detection of rotated SOTs by the magneto-optic-Kerr-effect (MOKE). We deposit a test sample consisting of Seed/PML/Cu(3)/Py(2)/Pt(3) and a control sample consisting of Seed/PML/Cu(3)/TaOx(3)/Py(2)/Pt(3), where Seed=Ta(2)/Cu(3), PML=[Co(0.16)/Ni(0.6)]8/Co(0.16), and the numbers in parentheses are nominal thicknesses in nanometers. At zero external magnetic field, the PML has perpendicular magnetization while Py has in-plane magnetization. As shown in FIG. 12(a), when an electric current is applied to the sample along the x-direction, a torque is generated in the Py layer with both field-like and damping-like symmetries. Present theory predicts the torque can be expressed in terms of an equivalent SOT field, $$\vec{h}_{SOT}=h_{DL}(\hat{m}_{Py}\times(\hat{I}\times\hat{z}))+h_{FL\_in}(\hat{I}\times\hat{z})+h_{FL\_out}\hat{z} \quad (3)$$

where $h_{DL}$ is the magnitude of the damping-like field, $h_{FL\_in}$ is the magnitude of the field-like field, including the in-plane Oersted field from the current and spin-orbit effective fields, $h_{FL\_out}$ is the magnitude of the out-of-plane Oersted field from the current, and $\hat{m}_{Py}$ is the unit magnetization direction of Py.

Assuming the initial magnetization of Py is aligned by an in-plane external magnetic field $H_{ext}$, $\hat{m}_{Py}$ will be tilted out-of-plane by the damping-like field. To the first order approximation, this tilting can be calculated as $$m_{Py\_z} = \frac{h_{DL}(\hat{m}_{Py}\cdot\hat{I}) + h_{FL\_out}}{|H_{ext}| + M_{eff}} \quad (4)$$

where $M_{eff}$ is the effective demagnetizing field along the z-direction in Py.

The out-of-plane magnetization tilting is detected by the polar MOKE with normal light incidence, where the Kerr rotation $\Psi_{polar}$ is proportional to $m_{Py\_z}$. If $\hat{I}$ is applied parallel to $H_{ext}$, the current-induced polar MOKE rotation is shown in FIG. 12(b). Here the hysteresis-like behavior is due to the hDL and the offset is due to the $h_{FL\_out}$, according to Eq. (4). The signal is independent on the initial direction of the PML magnetization $\hat{m}_{PML}$. By comparing the contributions due to the $h_{DL}$ and $h_{FL\_out}$ in a line scan measurement, we estimate that $h_{DL}$ is about 120±12 A/m when 30 mA electric current is applied through a 50 µm wide sample.

When $\hat{I}$ is applied perpendicular to $H_{ext}$, Eq. (4) suggests the out-of-plane magnetization tilting due to the damping-like field should vanish. Indeed, in the control sample with $TaO_x$ as seen in FIG. 12(c), very weak hysteresis-like signals independent on $\hat{m}_{PML}$ are observed, which is likely due to small misalignment. However, in the test sample, large polar MOKE signals are observed indicating significant out-of-plane magnetization tilting due to some damping-like fields. The magnitude is estimated to be 25% of the magnitude of $h_{DL}$, which is 30±4 A/m with the same current density described above. Strikingly, this damping-like field reverses as $\hat{m}_{PML}$ switches, suggesting such signals are not due to misalignment.

To understand the damping-like field that depends on $\hat{m}_{PML}$, we first extract the contribution from the damping-like field by taking the difference of $\Psi$polar when $\hat{m}_{Py}$ switches. The obtained values will then be added or subtracted when $\hat{m}_{PML}$ reverses, in order to separate damping-like fields depending on whether they are even or odd with $\hat{m}_{PML}$, $$\psi_{P\_even} = [\psi_{polar}(\hat{m}_{PML} = +z, +H_{ext}) - \psi_{polar}(\hat{m}_{PML} = +z, -H_{ext})] + \quad (5)$$
$$[\psi_{Polar}(\hat{m}_{PML} = -z, +H_{ext}) - \psi_{polar}(\hat{m}_{PML} = -z, -H_{ext})]$$

$$\psi_{P\_odd} = [\psi_{polar}(\hat{m}_{PML} = +z, +H_{ext}) - \psi_{polar}(\hat{m}_{PML} = +z, -H_{ext})] -$$
$$[\psi_{polar}(\hat{m}_{PML} = -z, +H_{ext}) - \psi_{polar}(\hat{m}_{PML} = -z, -H_{ext})]$$

Shown in FIG. 12(d), $\Psi_{P\_even}$ exhibits a cos $\phi$ dependence, while $\Psi_{P\_odd}$ exhibits a sin $\phi$ dependence, where $\phi$ is the angle between $H_{ext}$ and $\hat{I}$. This suggests that a new damping-like field should be added to Eq. (3), $$\vec{h}_{R\_DL}=h_{R\_DL}\hat{m}_{Py}\times((\hat{I}\times\hat{z})\times\hat{m}_{PML}) \quad (6)$$

where $h_{R\_DL}$ is the magnitude of the damping-like field of this rotated SOT.

Figure 13:
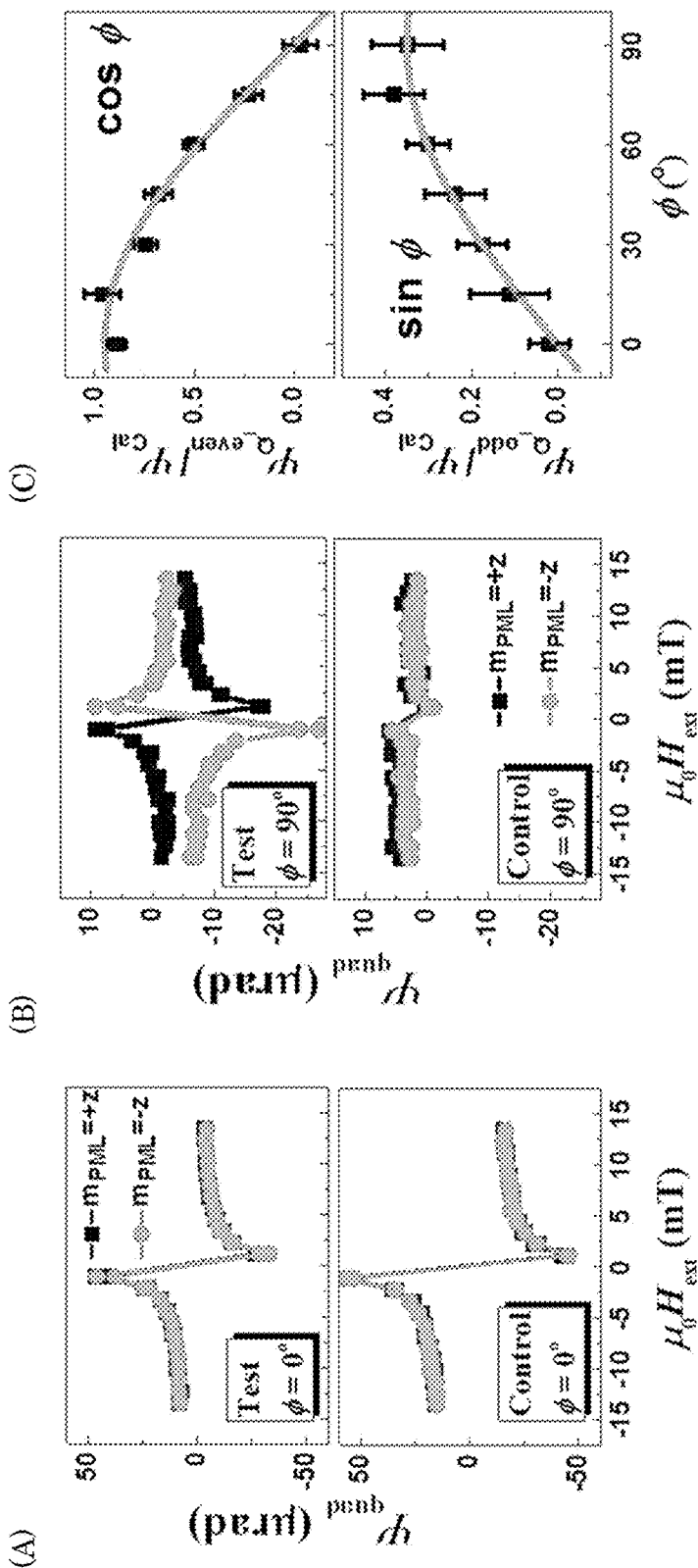
FIG. 13 shows field-like fields measured in the same configuration as shown in FIG. 12(a), detected by quadratic MOKE. In this measurement, normal incident light with linear polarization along the x-direction is used. Although in this measurement, the polar MOKE signal is also detected, it is weaker than the quadratic MOKE response and can be distinguished from fittings. (a) The quadratic MOKE response measured in the test (top) and control samples (bottom) when current is applied parallelly with Hext. No dependence on the initial magnetization of PML is observed. (b) The quadratic MOKE response measured in the test (top) and control samples (bottom) when current is applied perpendicularly to Hext. In the test sample, the quadratic MOKE response is reversed when the initial magnetization of PML is reversed. (c) The angle dependence of $\Psi Q\_even$ and $\Psi Q\_odd$ of the test sample. Here the values are extracted by performing linear fitting with $\Psi Cal$, which is the quadratic MOKE response measured with an external AC calibration field of 117±10 A/m. The slope is extracted and plotted here as $\Psi Q\_even/\Psi Cal$ and $\Psi Q\_odd/\Psi Cal$, respectively. Red lines are fittings using $\cos\phi$ and $\sin\phi$ functions.

We further measured the in-plane magnetization reorientation by using quadratic MOKE and observed similar symmetries. In-plane field $h_{FL\_in}$ Eq. (3) leads to in-plane magnetization tilting toward the y-direction.

$$m_{Py\_y} = \frac{h_{FL\_in}(\hat{I}\times\hat{z})\cdot\hat{y}}{|H_{ext}| \pm H_{an}} \quad (7)$$

where $H_{an}$ is the in-plane anisotropy field of Py and the ±sign depends on whether $\hat{m}_{Py}$ is parallel or anti-parallel with $H_{ext}$. The in-plane magnetization reorientation gives rise to a quadratic MOKE signal $\Psi_{quad}$ that is proportional to $(\hat{m}_{Py}\cdot\hat{y})(\hat{m}_{Py}\cdot\hat{x})$. When $\phi=0°$, as shown in FIG. 13(a), both the test and control samples exhibit $1/H_{ext}$-like quadratic MOKE response, as expected from Eq. (7). These signals are independent with the initial polarization of PML. As shown in FIG. 13 (b), when $\phi=90°$, the control sample exhibits very weak quadratic MOKE signal independent on $\hat{m}$ PML, consistent with Eq. (7). However, the test sample exhibits significant quadratic MOKE signals, which depend on the initial polarization of $\hat{m}_{PML}$.

Similar to Eq. (5), we separate $\Psi_{quad}$ depending on whether it is odd or even with $\hat{m}_{PML}$, $$\Psi_{Q\_even}=\Psi_{quad}(\hat{m}_{PML}=+z)+\Psi_{quad}(\hat{m}_{PML}+z)$$

$$\Psi_{Q\_odd}=\Psi_{quad}(\hat{m}_{PML}=+z)-\Psi_{quad}(\hat{m}_{PML}+z) \quad (8)$$

We further perform linear fitting of $\Psi_{Q\_even}$ and $\Psi_{Q\_odd}$ with a calibration signal $\Psi_{quad\_cal}$ measured with an external calibration field, and plot the slopes as a function of $\phi$ in FIG. 13(c). The similar symmetry as the damping-like field in FIG. 12(d) suggests that there is also a rotated field-like field, which can be described as $$\vec{h}_{R\_FL}=h_{R\_FL}(\hat{I}\times\hat{z})\times\hat{m}_{PML} \quad (9)$$

The magnitude of this field $h_{R\_FL}$ is extracted to be 41±13 A/m when $\phi=90°$, which is comparable to the rotated damping-like field $h_{R\_DL}$.

Figure 14:
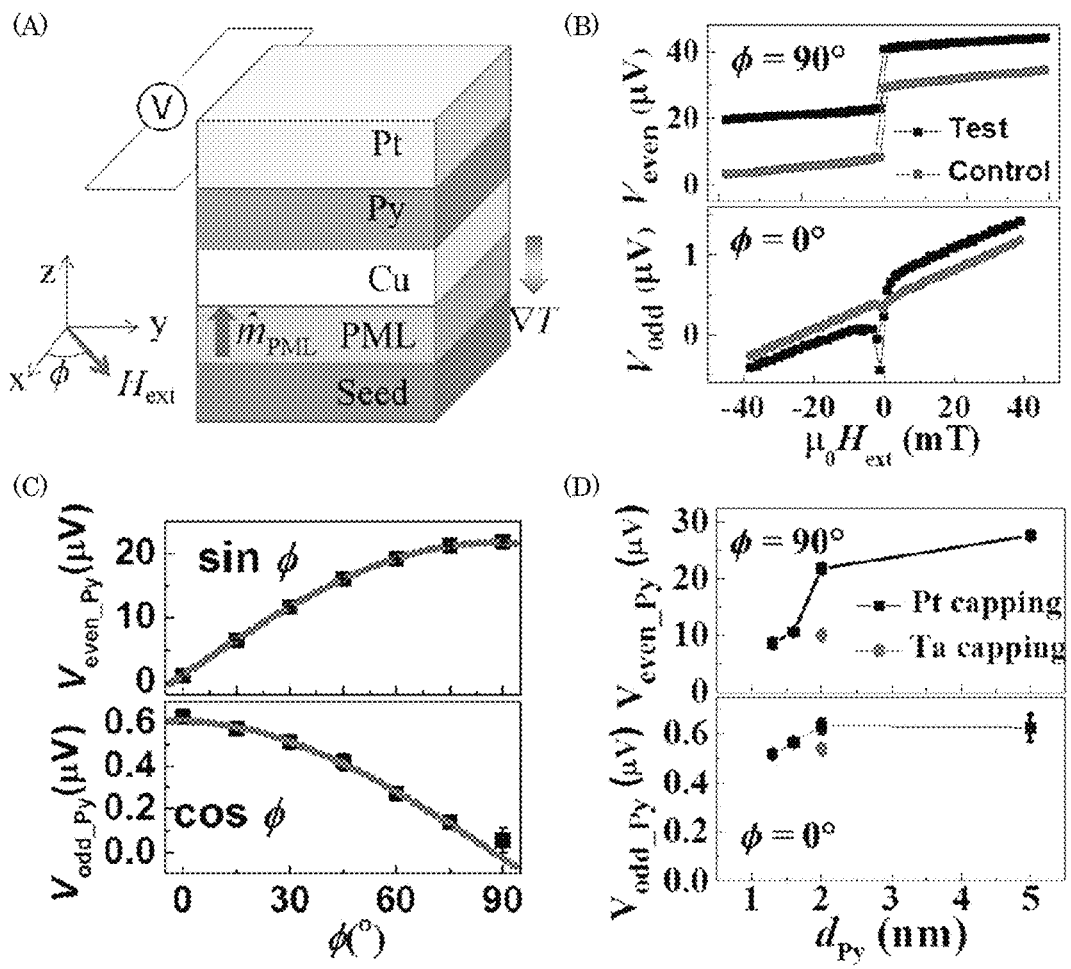
FIG. 14 shows (a) experimental configurations for the spin Seebeck effect-driven ISHE/IREE measurements. (b) Voltages measured in the two different configurations for the test sample (Seed/Perpendicular Magnetic Layer (PMO/Cu/Py/Pt) and control sample (Seed/PML/Cu/TaOx/Py/Pt). Voltages are scaled to 50 K of temperature difference by taking V/ΔT×50, wherein ΔT is the actual temperature difference detected in the measurement. (c) Angle dependence of VANE_Py and VSR. Red lines are fittings using sin φ and cos φ functions. (d) Py thickness dependence of VANE and VSR in Seed/PML/Cu(3)/Py(1.3-5)/Pt(3) and Seed/PML/Cu(3)/Py(2)/Ta(3)

In order to further understand the rotation of spin-orbit effects, we use the same samples to perform a spin Seebeck effect-driven ISHE/IREE measurement. As shown in FIG. 14(a), when the samples are subject to an out-of-plane temperature gradient, we measure in-plane voltages along the x-direction as the in-plane external field $H_{ext}$ is swept with an angle $\phi$ from the x-direction. The voltage may arise from the anomalous Nernst effect in the magnetic layers, ISHE/IREE due to the spin current injected from the magnetic layers into the adjacent layers as well as the planar Nernst effect in PML, $$V=\eta_{Py}(\hat{m}_{Py}\times\hat{\nabla}T)\cdot\hat{x}+\eta_{PML}(\hat{m}_{PML}\times$$
$$\vec{\nabla}T)\cdot\hat{x}_{PNE\_PML}(\hat{m}_{PML}\cdot\hat{x})(\hat{m}_{PML}\cdot\hat{\nabla}T) \quad (10)$$

where $\nabla T$ is the temperature gradient in the z-direction, $\eta_{Py}$, and $\eta_{PML}$ are, respectively, the coefficients associated to the Py and PML layers due to the combination of the anomalous Nernst effect and the ISHE/IREE, ηPNE_PML is the coefficient associated to the planar Nernst effect of PML.

Similar to Eq. (8), we further separate the voltage according to its symmetry on the initial direction of $\hat{m}_{PML}$, $$V_{even} = V(\hat{m}_{PML} = +\hat{z}) + V(\hat{m}_{PML} = -\hat{z})$$

$$V_{odd} = V(\hat{m}_{PML} = +\hat{z}) - V(\hat{m}_{PML} = -\hat{z}) \quad (11)$$

As shown in FIG. 14(b), $V_{even}$ measured when $H_{ext}$ is along the y-direction consists of two components: one resembles the hysteretic switching of Py (first term in Eq. (10)), and a linear slope related to the magnetization tilting of the PML under the influence of external field (second term in Eq. (10)). When $H_{ext}$ is applied along the x-direction, the first two terms in Eq. (10) shall vanish. $V_{odd}$ measured for the control sample yields a straight line, which is consistent with the planar Nernst effect described in Eq. (10). However, $\nabla V_{odd}$ measured for the test sample has an additional component related to the Py magnetization switching, which is not described in Eq. (10). The angle dependence of this component shown in FIG. 14(c) suggests that the voltage component can be described as $$V_{odd\_Py\_Py} = \eta_R (\vec{m}_{Py} \times \vec{m}_{PML}) \times \vec{\nabla} T \quad (12)$$

where $\eta_R$ is the corresponding coefficient. Equation (12) bears the same rotated symmetry as in Eqs. (6) and (9).

We further studied the Py-thickness dependence of $V_{even\_Py}$ and $V_{odd\_Py}$ measured in the two configurations, $\phi=90°$ and $\phi=0°$, respectively. Shown in FIG. 3 (d), $V_{even\_Py}$, which is due to the Anomalous Nernst effect and the ISHE/IREE, exhibits a monotonic increase with the Py thickness. This is because the Anomalous Nernst effect is a bulk effect that all Py contributes to the voltage. When the capping layer Pt is replaced with Ta, $V_{ANE}$ changes dramatically, which may be due to magnetic dead layer near the Ta/Py interface and that Ta contributes to a different ISHE/IREE signal than Pt. In sharp contrast, $V_{odd\_Py}$ exhibits much weaker thickness dependence and is much less sensitive to the capping layer than VANE. This suggests $V_{odd\_Py}$ has a very short characteristic length scale.

Based on the comparison between the test and control samples, we think the spin current flowing between the two magnetic layers is essential for the observed rotated SOT and rotated ISHE/IREE-like voltage. Since the spin rotation and spin-orbit interactions at the Cu/ferromagnetic metal (FM) interface have been found to be weak, we speculate the phenomena may be related to the spin-orbit interaction of transverse spins in the FM itself. Taking the rotated SOT as an example, an in-plane electric current through PML, may generate a perpendicularly flowing spin current with spins polarized along $\hat{I}$. If we attribute the $h_{R\_DL}$ measured in FIG. 12 to solely arise from such a spin current, we can estimate an effective spin Hall angle that accounts for the rotated damping-like SOT to be $$\theta_R = \frac{h_{R\_DL} \mu_0 M_s d_{Py}}{\frac{\hbar}{2e} \frac{I\zeta}{w d_{PML}}} \approx 0.01 \quad (13)$$

where w=50 μm is the width of the sample, $d_{PML}$ and $d_{Py}$ are respectively the thicknesses of PML and Py, $\zeta$ is the ratio of current flowing through PML, which is estimated to be 25%. It should be emphasized that in Eq. (13), we have assumed perfect spin transmission at the Cu/Py interface. In a more direct comparison, the effective spin Hall angle of Pt in Py(2)/Cu(3)/Pt(3) is found to be 0.04.

Figure 15:
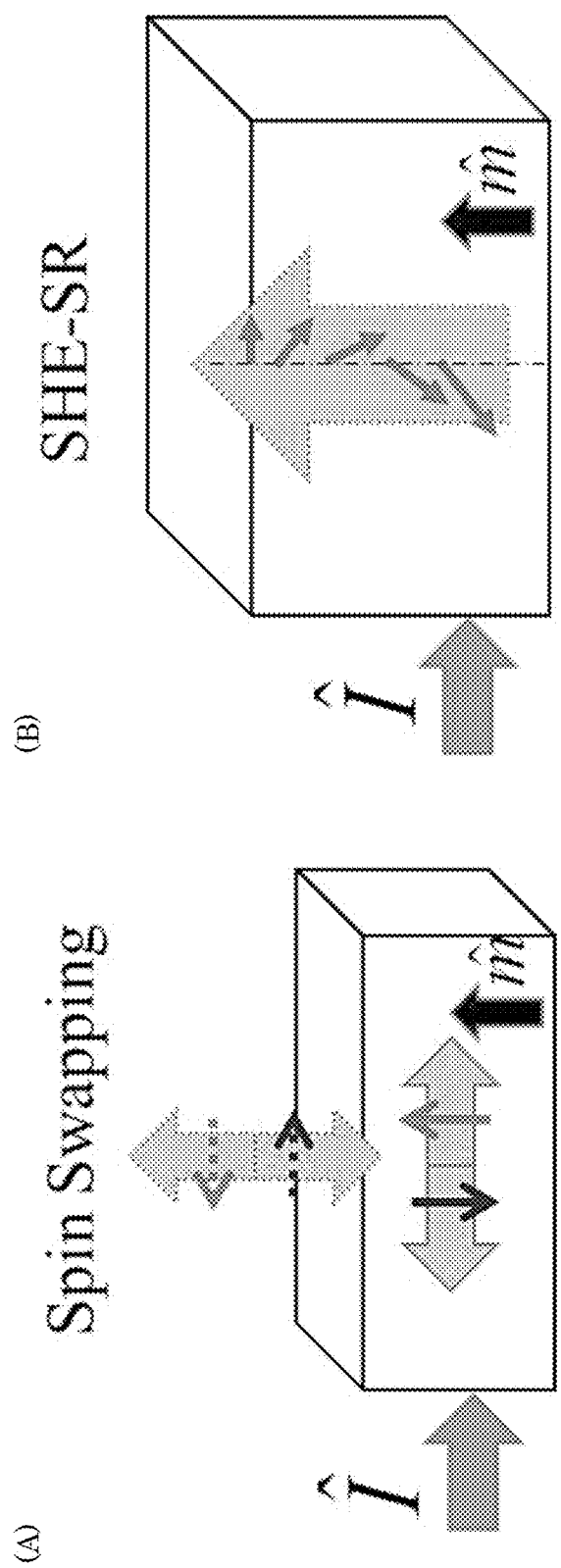
FIG. 15 shows a spin swapping process in a ferromagnet (FM). Electric current generates a spin current in the FM with flow along the electric current direction and polarization collinear with the surface normal, which is then converted to a new spin current with the spin and spin current directions swapped. (b) Schematics of the SHE-spin rotation (SHE-SR) process in an FM. Transverse spins are generated from an electric current via the spin Hall effect. The transverse spins precess around the magnetization (black dashed line) and dephase as they travel perpendicular to the film.

One possible mechanism that can lead to such a spin current is the spin swapping effect. The electric current $\hat{I}$ through PML generates a spin current along $\hat{I}$ with spins parallel with $\hat{m}_{PML}$ due to spin-dependent scattering. It may be that the spin-orbit interaction will lead to a new spin current that flows along $\hat{m}_{PML}$ but polarized along $\hat{I}$, as illustrated in FIG. 15(a). Alternatively, spin rotation may also lead to the spin current polarized along $\hat{I}$. As shown in FIG. 15 (b), conventional SHE gives rise to spin current polarized along $\hat{I} \times \hat{z}$. As the spins exiting PML, they precess around $\hat{m}_{PML}$ due to the exchange interaction. This leads to spin current polarized along $\hat{m}_{PML} \times (\hat{I} \times \hat{z})$, which is parallel with $\hat{I}$. The rotated ISHE/IREE-like voltage may be explained as the reverse process. Both mechanisms speculated here are related to transverse spins in a ferromagnet, which are often neglected due to the strong dephasing.

Our results show interesting spin-orbit effects with rotated symmetry in magnetic multilayers. Although allowed by symmetry, the magnitudes of these effects are expected to be weak due to transverse spin dephasing. The significant signals observed here suggest that there are more sophisticated mechanisms associated with the interplay between spin-orbit interaction and magnetism. Being able to generate spin-orbit torque in unconventional geometry is useful for the development of spin-torque magnetic random access memory.

The samples used in this Example are fabricated by magnetron sputtering. In the thermal measurement, the samples are typically cut into a 2 mm×25 mm strip. The samples are sandwiched in between two aluminum plates. The aluminum plates are attached to Peltier elements to create a typical temperature difference across the sample. The typical temperature difference measured on the two aluminum plates is 50 K. The voltage across the sample is measured by a Keithley nano voltmeter 2182. We typically measure the hysteretic loops for 10-20 times and take the average. Possible drifts in the measurement are removed mathematically by assuming the drift is linear with measurement time. In the MOKE measurement, the sample is patterned into a 50 μm×50 μm square.

Embodiments of the subject matter and the operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions, encoded on a computer storage medium for execution by, or to control the operation of, data processing apparatus. Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more computers executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, workstations, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, optical disks, USB drives, and so on. However, a computer need not have such devices. Moreover, a computer can be embedded in another device, e.g., a mobile telephone, a personal digital assistant (PDA), a microwave oven, mobile audio or video player, a game console, a Global Positioning System (GPS) receiver, or a portable storage device (e.g., a universal serial bus (USB) flash drive), to name just a few. Devices suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The central processing unit and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks). Such interconnects may involve electrical cabling, fiber optics, or be wireless connections.

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A nonvolatile memory cell to store a memory bit, the nonvolatile memory cell comprising:
    a first fixed magnetic layer comprising a first fixed magnetic state and that conducts electrical current;
    a first nonmagnetic electrode disposed on the first magnetic layer and that conducts electrical current;
    a memory storage layer disposed on the first nonmagnetic electrode and comprising the memory bit, the memory bit being in a first magnetic state or a second magnetic state, the memory storage layer being switchable between the first magnetic state and the second magnetic state in response to a direction of electrical current present in the first nonmagnetic electrode, the memory bit being stored or written in the memory storage layer as the first magnetic state or the second magnetic state, the first nonmagnetic electrode being interposed between the first fixed magnetic layer and the memory storage layer, and the first fixed magnetic state being oriented orthogonal to the first magnetic state and the second magnetic state;
    a tunnel barrier layer disposed on the memory storage layer such that the memory storage layer is interposed between the tunnel barrier layer and the first nonmagnetic electrode;
    a second fixed magnetic layer comprising a second fixed magnetic state and that conducts electrical current, the tunnel barrier layer interposed between the memory storage layer and the second fixed magnetic layer, and the second fixed magnetic state being aligned with the memory bit in the memory storage layer; and
    a second nonmagnetic electrode disposed on the second fixed magnetic layer and that conducts electrical current, the second fixed magnetic layer being interposed between the tunnel barrier layer and the second nonmagnetic electrode.

2. The nonvolatile memory cell of claim 1, further comprising an intermediate layer interposed between the second fixed magnetic layer and the second nonmagnetic electrode.

3. The nonvolatile memory cell of claim 1, further comprising a power source in electrical communication with the first fixed magnetic layer and the first nonmagnetic electrode and that provides electrical current through the first fixed magnetic layer and the first nonmagnetic electrode.

4. The nonvolatile memory cell of claim 3, wherein:
    when the electrical current flows in a first direction in the first nonmagnetic electrode, the memory bit is in the first memory state in the memory storage layer; and when the electrical current flows in a second direction in the first nonmagnetic electrode, the memory bit is in the second memory state in the memory storage layer.

5. The nonvolatile memory cell of claim 1, further comprising a resistance meter in electrical communication with the first nonmagnetic electrode and the second nonmagnetic electrode and that measures an electrical resistance across the memory storage layer.

6. The nonvolatile memory cell of claim 1, wherein the memory storage layer has a first electrical resistance in the first magnetic state, and the memory storage layer has a second electrical resistance in the second magnetic state.

7. In a memory system comprising the nonvolatile memory cell of claim 1, a process for writing or reading the memory bit, the process comprising:

subjecting the first nonmagnetic electrode to an electrical current flowing in a first direction through the first nonmagnetic electrode; and storing the memory bit as the first magnetic state in the memory storage layer, in response to the electrical current flowing in the first direction through the first nonmagnetic electrode, to write the memory bit in the nonvolatile memory cell.

8. The process of claim 7, further comprising:

measuring an electrical resistance of the memory storage layer relative to the second fixed magnetic layer to read the memory bit stored in the memory storage layer of the nonvolatile memory cell.

9. The process of claim 7, further comprising:

subjecting the first nonmagnetic electrode to an electrical current flowing in a second direction through the first nonmagnetic electrode; and storing the memory bit as the second magnetic state in the memory storage layer, in response to the electrical current flowing in the second direction through the first nonmagnetic electrode, to write the memory bit in the nonvolatile memory cell.

10. The process of claim 9, further comprising:

measuring an electrical resistance of the memory storage layer relative to the second fixed magnetic layer to read the memory bit stored in the memory storage layer of the nonvolatile memory cell.

* * * * *